US009404028B2

(12) United States Patent
Lin et al.

(10) Patent No.: US 9,404,028 B2
(45) Date of Patent: Aug. 2, 2016

(54) HEAT CONDUCTING COMPOSITE MATERIAL AND LIGHT-EMITTING DIODE HAVING THE SAME

(71) Applicant: RITEDIA CORPORATION, Hsinchu County (TW)

(72) Inventors: Hung-Cheng Lin, New Taipei (TW); I-Chiao Lin, Taipei (TW)

(73) Assignee: RITEDIA CORPORATION, Hukou Township, Hsinchu County (TW)

( * ) Notice: Subject to any disclaimer, the term of this patent is extended or adjusted under 35 U.S.C. 154(b) by 23 days.

(21) Appl. No.: 14/075,921

(22) Filed: Nov. 8, 2013

(65) Prior Publication Data

US 2014/0131757 A1 May 15, 2014

(30) Foreign Application Priority Data

Nov. 12, 2012 (TW) .............................. 101142006 A

(51) Int. Cl.
*H01L 33/00* (2010.01)
*H01L 27/15* (2006.01)
*H01L 29/267* (2006.01)
(Continued)

(52) U.S. Cl.
CPC ................ *C09K 5/14* (2013.01); *H01L 33/641* (2013.01); *A41D 13/015* (2013.01); *B82Y 10/00* (2013.01); *C02F 1/02* (2013.01); *H01L 33/642* (2013.01); *H01L 33/644* (2013.01); *H01L 2224/48091* (2013.01); *Y02W 10/37* (2015.05)

(58) Field of Classification Search
CPC ........... H01L 2224/48091; H01L 2924/00014; H01L 29/1606; H01L 29/66015; H01L 33/52; H01L 33/56; H01L 33/641; H01L 33/642; H01L 33/644; C09K 5/14; Y02W 10/37; A41D 13/015; A41D 13/0568; A41D 13/0153; A63B 71/12; A63B 71/1225; C02F 1/02; C02F 1/025; C02F 1/34; C02F 2101/32; B01J 19/06; B82Y 10/00; B82Y 30/00; B05D 3/06; B05D 1/02; B05D 1/60
USPC ........ 252/71, 74, 75, 76; 257/79, 81, 99, 431, 257/432, 433, 459, 100; 2/455; 210/600; 427/457
See application file for complete search history.

(56) References Cited

U.S. PATENT DOCUMENTS

2009/0309116 A1* 12/2009 Kato et al. ...................... 257/98
2011/0098420 A1* 4/2011 Takizawa et al. ............. 525/477
(Continued)

FOREIGN PATENT DOCUMENTS

| KR | 2012029339 A | * | 3/2012 |
| TW | 201145474 A1 | | 12/2011 |
| TW | 201217446 A1 | | 5/2012 |
| TW | 201220562 A1 | | 5/2012 |
| WO | WO 2012102559 A2 | * | 8/2012 |

*Primary Examiner* — Teresa M Arroyo
(74) *Attorney, Agent, or Firm* — Muncy, Geissler, Olds & Lowe, P.C.

(57) ABSTRACT

A heat conducting composite material includes a matrix and a graphene sheet. The graphene sheet has a two-dimensional planar structure, and a basal plane of the graphene sheet has a lateral size between 0.1 nm and 100 nm such that the graphene sheet has a quantum well structure. When radiation energy passes through the heat conducting composite material, the radiation energy is converted into infrared light by the quantum well structure of the graphene sheet to achieve high radiating efficiency. A light-emitting diode (LED) having the heat conducting composite material and capable of achieving a heat dissipation effect is further disclosed.

13 Claims, 3 Drawing Sheets

(51) Int. Cl.
| | |
|---|---|
| H01L 31/12 | (2006.01) |
| H01L 31/0203 | (2014.01) |
| A41D 13/015 | (2006.01) |
| C02F 1/02 | (2006.01) |
| B01J 19/08 | (2006.01) |
| C09K 5/14 | (2006.01) |
| H01L 33/64 | (2010.01) |
| B82Y 10/00 | (2011.01) |

(56) References Cited

U.S. PATENT DOCUMENTS

| | | | |
|---|---|---|---|
| 2011/0159372 A1* | 6/2011 | Zhamu et al. | 429/232 |
| 2013/0180912 A1* | 7/2013 | Li | 210/500.21 |
| 2013/0201654 A1* | 8/2013 | Pickard | 362/84 |
| 2013/0221219 A1* | 8/2013 | Torabi | 250/338.1 |
| 2013/0273345 A1* | 10/2013 | Chua et al. | 428/221 |

* cited by examiner

HEAT CONDUCTING COMPOSITE MATERIAL AND LIGHT-EMITTING DIODE HAVING THE SAME

FIELD OF THE INVENTION

The present invention relates to a heat conducting composite material and a light-emitting diode (LED) having the same, and more particularly to a heat conducting composite material capable of conducting heat through converting radiation energy to infrared light, and an LED having the same.

BACKGROUND OF THE INVENTION

Accompanied with the thriving electronic industries in the 21$^{st}$ century, electronic products have become indispensible commodities in the daily life. Manufacturers in general develop electronic products by aiming for function versatility and high performance, and frequently integrate LED chips into these electronic products. As portable electronic products continue to increase in diversity and decrease in size and weight, heat conduction efficiency of electronic products is a focus that draws much attention.

Current LED chips, having high illumination intensity, are widely employed in applications of electronic devices including display backlight sources, small-sized projectors and illumination devices. Approximately 80% of energy of power inputted into an LED is converted into heat energy. In the event that a carrier board of an LED element fails to effectively radiate the heat, the temperature at an interface of the LED chip may rise. In addition to undesirably affecting the illumination strength, the heat may also accumulate to cause expansion of layered materials of the LED chip and thus damage the overall structure to even lead to a shortened lifecycle of the product. Further, since the excited light in the LED is diffused by radiation instead of being entirely scattered via the surface of the LED, unsatisfactory and ineffective light extraction is resulted.

Based on the above reasons, if the heat conduction efficiency of LEDs can be improved and undesirable influences of thermal expansion of LEDs can be mitigated or eliminated, and a structure with an overall design capable of enhancing the heat conduction efficiency can be provided, it is apparent that developments of the electronic industries can be in large promoted.

Graphene is commonly defined as a sheet in a one-atom thickness and consisted of carbon atoms having sp$^2$ bonding. The carbon atoms are closely arranged into a benzene structure in beehive crystallized lattices. Such two-dimensional material presents an extremely high electrical stability and outstanding heat conductivity at a plane of a layered structure. A plurality of parallel graphene layers stacked on one another are formed by graphite. The application of graphene on different products and materials is currently an inevitable trend.

For example, the Taiwan Patent TW201217446 discloses a polymer resin composition, an insulation film manufactured using the polymer resin composition, and a method of manufacturing the insulation film. The above insulation film including graphene is applied to an electronic circuit board to reduce the coefficient of thermal expansion. For another example, the Taiwan Patent TW201220562 discloses a radiating substrate, a method for manufacturing the radiating substrate and a luminous element package with the radiating substrate. In the above disclosure, the radiating substrate includes a macromolecular resin and graphene distributed in the macromolecular resin, and dissipates heat generated by a predetermined heating element to the exterior. For another example, the Taiwan Patent TW201145474 discloses an electronic/optoelectronic heat dissipating device, in which graphene or a carbon nanotube (CNT) cooperates with a current semiconductor element (e.g., an LED optoelectronic element or an integrated circuit element) to serve for heat dissipation purposes. As such, overall heat dissipation efficiency can be enhanced through the high coefficient of thermal expansion and the even heat conductivity of the graphene or CNT.

However, the above solutions of heat dissipation materials offer solutions from only perspectives of heat conduction. That is to say, in addition to having high heat conductivity, if a composite material can also achieve heat conduction via other heat conduction means, products applying such composite material may further reduce the influences that thermal factors pose on the lifecycle and performance of the products.

Therefore, there is a need for such composite material.

SUMMARY OF THE INVENTION

Therefore the primary object of the present invention is to provide a heat conducting composite material having a quantum well structure. Through the quantum well structure, radiation energy is converted to infrared light when passing through the composite material to effective achieve heat conduction, even in the event that an overall structure is thermally expanded due to a part of the energy that is not dispersed from an LED.

To achieve the above object, a heat conducting composite material is provided according to an embodiment of the present invention. The heat conducting composite material includes a matrix and a plurality of graphene sheets. The graphene sheets are two-dimensional planar structures. A basal plane of each graphene sheet has a lateral size (La) between 0.1 nm and 100 nm, and comprises a quantum well structure.

Preferably, the lateral size (La) of the basal plane of each graphene sheet is between 20 nm and 70 nm. More preferably, the lateral size (La) of the basal plane of each graphene sheet is between 30 nm and 50 nm. Further, a ratio of the lateral size (La) of the basal plane of each graphene sheet to a distance value (Lc) between stacked layers is 100 to 1,250,000. Preferably, the ratio of the lateral size (La) of the basal plane of each graphene sheet to a distance value (Lc) between stacked layers is 250 to 50,000.

As the graphene sheets of the present invention need to have perfect two-dimensional planar structures, most ideal graphene sheets are expectedly formed by only hexagonal crystals. Any pentagonal or heptagonal crystals may cause defects that change the levelness of the basal planes of the graphene sheets. For example, one single pentagonal crystal may warp the plane into an arched surface, and 12 pentagonal crystals may form into a flat fullerene. Similarly, one single heptagonal crystal may warp the plane into a saddle shape. Therefore, graphene sheets having a high degree of graphitization are required.

The degree of graphitization above refers to a ratio of graphite, and theoretically includes graphene planes spaced by 3.354 angstroms. Therefore, a degree of graphitization of 1 means that 100% of the graphite is carbon atoms that are hexagonal structures having a basal plane spaced by a graphite planar distance ($d_{(0002)}$) of 3.354 angstroms. A higher degree of graphitization indicates a smaller planar distance of graphite. The degree of graphitization (G) can be calculated by equation (1) below.

$$G=(3.440-d_{(0002)})/(3.440-3.354) \qquad \text{equation (1)}$$

Further, $d_{(0002)}$ can be calculated according to G by equation (2) below.

$$d_{(0002)}=3.354+0.086(1-G) \qquad \text{equation (2)}$$

According to equation (1), 3.440 angstroms represent a distance between layers of amorphous carbon basal planes (Lc=50 Å), and 3.354 angstroms represent a distance of pure graphite (Lc=1000 Å). Pure graphite is carbon that can be graphitized by burning at 3000° C. for a prolonged period of time (e.g., 12 hours). A higher degree of graphitization corresponds to a larger crystal size, and can be expressed by the lateral size (La) of the basal plane and the distance value (Lc) between layers. It should be noted that, the size parameter is inversely proportional to a gap of a lower surface. Throughout the specification, the degree of graphitization, although being dependent on the material adopted, is however usually greater than or equal to 0.8. In the embodiments of the present invention, a high degree of graphitization refers to a degree of graphitization of approximately 0.85.

In the present invention, the graphene sheets in the heat conducting composite material include a carbon atom beehive structure formed with $sp^2$ bonding, and a quantum well structure is formed by a single layer of graphene sheet of multiple layers of graphene sheets. With the above structures and properties, when radiation energy takes effect on the heat conducting composite material of the present invention, the radiation energy may enter the quantum well structure along a direction of the distance value (Lc) of the stacked layers of the graphene (i.e., a covalent bonding region perpendicular to the lateral size (La) of the basal plane). As such, the radiation energy is first converted into infrared light (having a wavelength between 0 μm and 20 μm), and exits the quantum well structure from a damping bonding region along the direction of the lateral size (La) of the basal plane of the graphene and at the same time dissipates the heat energy into the air.

The radiation energy is retained in the quantum well structure of the graphene sheets, and the wavelength of the converted light needs to satisfy characteristics of energy gaps of the quantum well structure of the graphene sheets. Thus, the radiation energy can be easily converted into infrared light in the quantum well structure of the graphene sheets.

In general, the radiation rate at a surface of a metal material is below 0.10, the radiation rate at a surface of a macromolecular material is approximately 0.80, and the radiation rate at a surface of graphene may achieve as high as 0.80 to 1.00. Therefore, with the heat conducting composite material of the present invention, the radiation energy can be converted into infrared light by the quantum well structure of the graphene sheets when the radiation energy passes through the graphene, so as to achieve effective heat conduction.

In an embodiment of the present invention, the graphene sheet may be a transparent graphene sheet. Thus, when applying the heat conducting composite material of the present invention as a package material of an LED, the transparent graphene sheet of the LED poses a minimal effect on the light extraction rate of the LED. Further, the graphene sheet may constitute 0.1 wt % to 15 wt % of the total weight and be incorporated into the matrix. Further, the graphene sheet may be a single-layer sheet structure or a multi-layer sheet structure. Preferably, the number of layers of the multi-layer sheet structure is between 2 and 100, more preferably between 10 and 70, and most preferably between 20 and 40. Moreover, when the graphene sheets are a single-layer structure, the light transmittance rate may achieve as high as above 97.5%.

The matrix of the present invention may be a group or a combination selected from an organic material, a fiber material, a ceramic material and a metal material. The organic material may be one or a combination of phenolic resin, epoxy, polyester resin, polyamide resin, polyimide resin, polycarbonate resin, polystyrene resin, polyethylene terephthalate, glycol, high density polyethylene, polyvinylchloride, low density polyethylene, polypropylene, polystyrene and polyphenylene carbonate. The fiber material may be one or a combination from glass fiber, carbon fiber, boron fiber, aramid fiber, silicon carbide fiber and asbestos fiber. The ceramic fiber may be one or a combination from aluminum oxide, silicon carbide and aluminum oxide.

The heat conducting composite material of the present invention may further comprise an additive. The additive may be a group or a combination selected from fluorescent powder, a carbon nanotube, hexagonal boron oxide, quartz and a similar material.

A thermal garment is provided according to an embodiment of the present invention. The thermal garment includes the above heat conducting composite material of the present invention. For example, the matrix of the heat conducting composite material is carbon fiber that incorporates graphene sheets. When solar radiation energy radiates upon the thermal garment, the solar radiation energy is converted into infrared light to offer a thermal effect to a person wearing the thermal garment.

A solar microwave water purifier is provided according to an embodiment of the present invention. The solar microwave water purifier includes the above heat conducting composite material of the present invention. For example, the heat conducting composite material is utilized as a cover of the solar microwave water purifier, and the matrix of the heat conducting composite material is polypropylene that incorporates graphene sheets. When solar radiation energy radiates upon the cover of the solar microwave water purifier, the solar radiation energy is converted into infrared light to heat up foul water in the solar microwave water purifier.

An infrared paint material is provided according to an embodiment of the present invention. The infrared paint material includes the above heat conducting composite material of the present invention. For example, when paint or resin paint is adopted as the matrix of the heat conducting composite material, the heat conducting composite material may be incorporated with graphene sheets to achieve thermal storage or high temperature resistance according to requirements.

To achieve the above object, an LED is further provided according to an embodiment of the present invention. The LED includes an insulating substrate, a chip, a conducting wire frame, a conducting wire and a transparent package material. The chip is disposed on the insulating substrate. The conducting wire frame is clamped between the insulating substrate and the chip. The conducting wire has one end connected to the chip and the other end connected to the wire conducting frame. The transparent package material is the above heat conducting composite material of the present invention, and is covered on the insulating substrate.

Thus, the LED of the present invention is capable of converting radiation energy emitted from the chip into infrared light via the transparent package material, thereby enhancing an overall heat dissipation effect of the LED.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
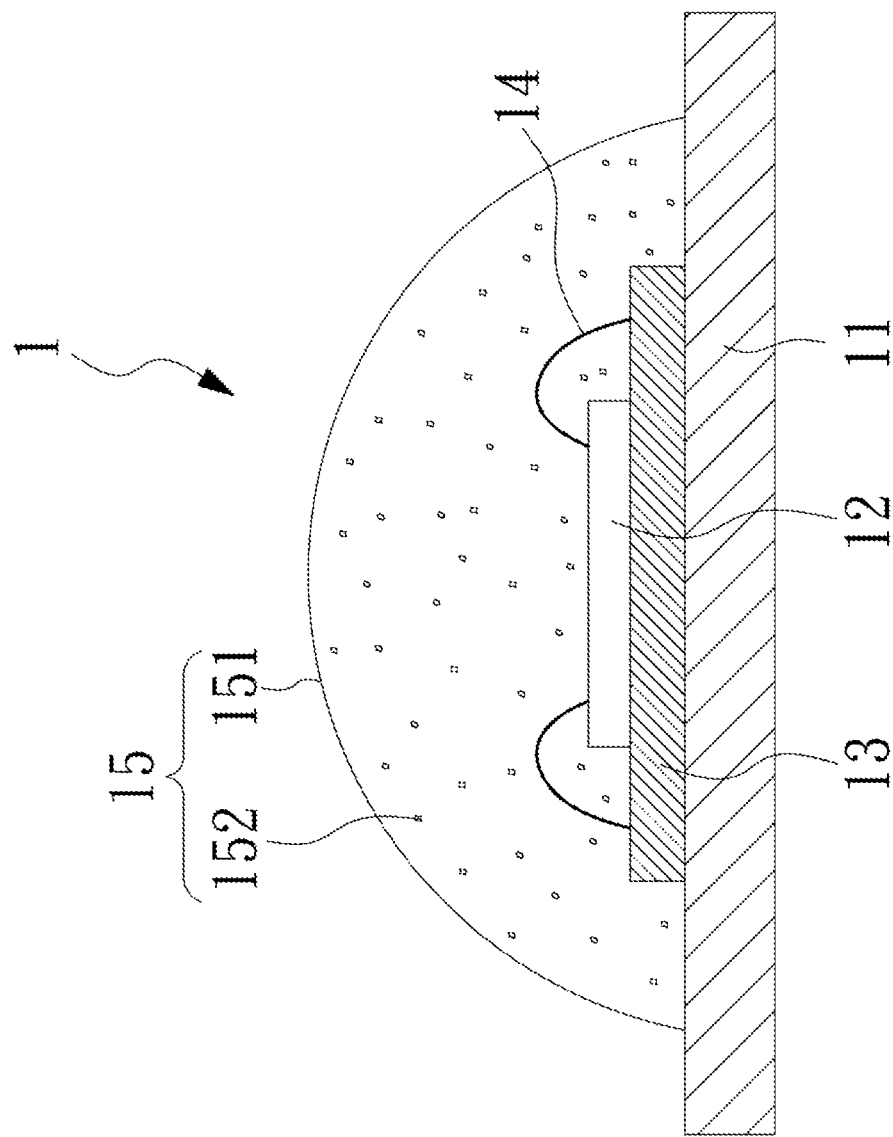
FIG. 1 is a schematic diagram of an LED according to an embodiment of the present invention.

Embodiments are described with reference to the accompany drawings below. Shapes, sizes and ratios of the objects are exemplary for one skilled person in the art to understand the application, not to limit the application. Each of the disclosed embodiments has one or more technical features. However, it does not mean that implementation of the application needs every technical feature of any embodiment of the application or combination of the embodiments of the application is prohibited. In other words, in possible implementation, one skilled person in the art would selectively implement part or all technical features of any embodiment of the application or selectively combine part or all technical features of the embodiments of the application based on the disclosure of the application and his/her own need. Implementation of the application is flexible.

Embodiment 1

For satisfying the demand for a heat conducting composite material, a heat conducting composite material is provided according to a preferred embodiment of the present invention. The heat conducting composite material includes a matrix and a plurality of graphene sheets. The graphene sheets are two-dimensional planar structures. A basal plane of each graphene sheet has a lateral size (La) between 0.1 nm and 100 nm, such that the graphene sheet comprises a quantum well structure. Preferably, the size of the basal plane of each graphene sheet is between 20 nm and 70 nm. More preferably, the lateral size (La) of the basal plane of each graphene sheet is between 30 nm and 50 nm. In the embodiment, the lateral size (La) of the basal plane of each graphene sheet is between 35 nm and 45 nm.

Therefore, with the heat conducting composite material according to the embodiment, when radiation energy passes through the graphene sheets, the radiation energy is converted into infrared light by the quantum well structure of the graphene sheet to achieve high heat conduction efficiency.

In the embodiment, the graphene sheets may be a single-layer sheet structure or a multi-layer sheet structure. Preferably, the number of layers of the multi-layer sheet structure is between 2 and 100, more preferably between 10 and 70, and most preferably between 20 to 40. Thus, the distance (Lc) between layers of the graphene sheets is in a nanometer scale between 6 nm and 12 nm. Further, the graphene sheets may constitute 0.1 wt % to 15 wt % of the total weight and be incorporated into the matrix. In the embodiment, the graphene sheets may constitute 5 wt % of the total weight of the heat conducting composite material.

In the embodiment, the matrix may be at least one group or a combination selected from an organic material, a fiber material, a ceramic material and a metal material. The organic material may be one or a combination of phenolic resin, epoxy, polyester resin, polyamide resin, polyimide resin, polycarbonate resin, polystyrene resin, polyethylene terephthalate, glycol, high density polyethylene, polyvinylchloride, low density polyethylene, polypropylene, polystyrene and polyphenylene carbonate. The fiber material may be one or a combination from glass fiber, carbon fiber, boron fiber, aramid fiber, silicon carbide fiber and asbestos fiber. The ceramic fiber may be one or a combination of aluminum oxide, silicon carbide and aluminum oxide.

The heat conducting composite material of the present invention may further comprise an additive. The additive may be a group or a combination selected from fluorescent powder, a carbon nanotube, hexagonal boron oxide, quartz and a similar material. In the embodiment, the matrix is an organic material of epoxy, and the heat conducting composite material may further comprise hexagonal boron oxide or a carbon nanotube.

Embodiment 2

FIG. 1 shows a schematic diagram of an LED according to an embodiment of the present invention. Referring to FIG. 1, an LED 1 includes an insulating substrate 11, a chip 12, a conducting wire frame 13, a conducting wire 14 and a transparent package material 15. The chip 12 is disposed on the insulating substrate 11. The conducting wire frame 13 is clamped between the insulating substrate 11 and the chip 12. The conducting wire 14 has one end connected to the chip 12, and the other end connected to the conducting wire frame 13. The transparent package material 15 is a heat conducting composite material described in the foregoing embodiment, and includes epoxy 151 and a plurality of graphene sheets 152. Further, the transparent package material 15 is covered on the insulating substrate 11.

Figure 2:
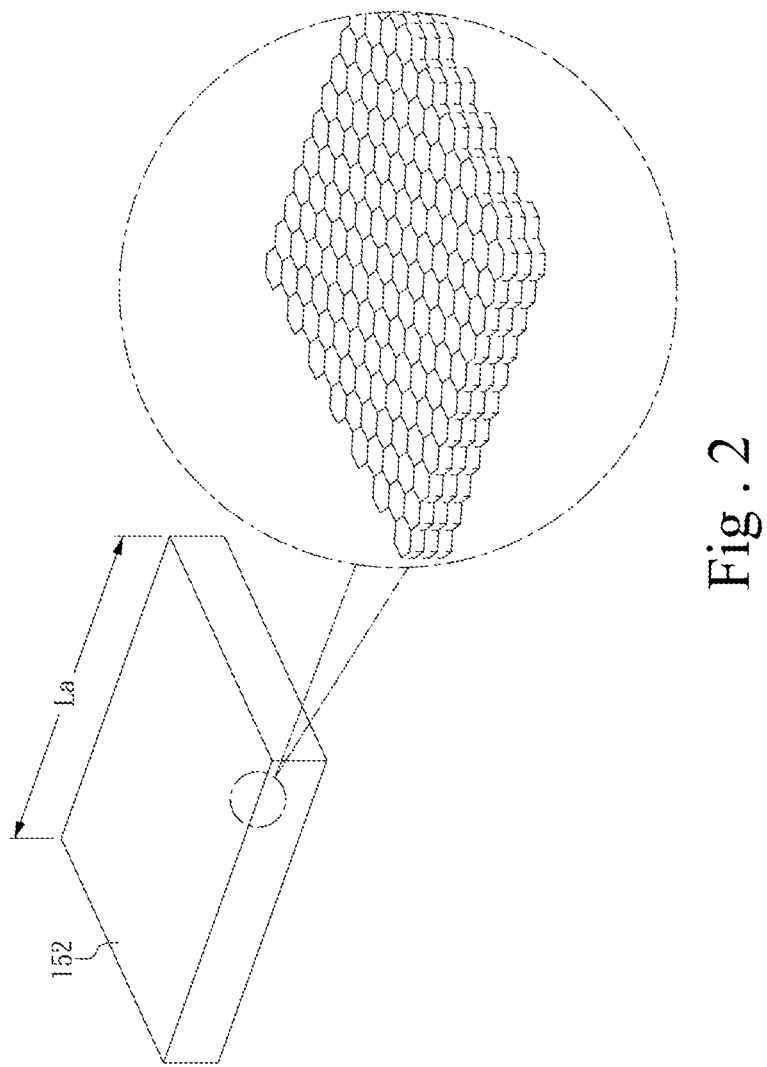
FIG. 2 is a schematic diagram of a graphene sheet according to an embodiment of the present invention.

FIG. 2 shows a schematic diagram of a graphene sheet according to an embodiment of the present invention. Referring to FIGS. 1 and 2, the graphene sheet 152 is formed by hexagonal crystals. Hence, not only the lateral size of the basal plane of the graphene sheet 152 is in a nanometer scale, but also the graphene sheet 152 has a complete two-dimensional planar structure as the graphene sheet 152 is in an arrangement made up by completely hexagonal crystals.

Thus, the LED 1 of the present invention is capable of converting radiation energy emitted from the chip into infrared light by the transparent package material to achieve high overall heat dissipation efficiency for the LED.

Embodiment 3

Figure 3:
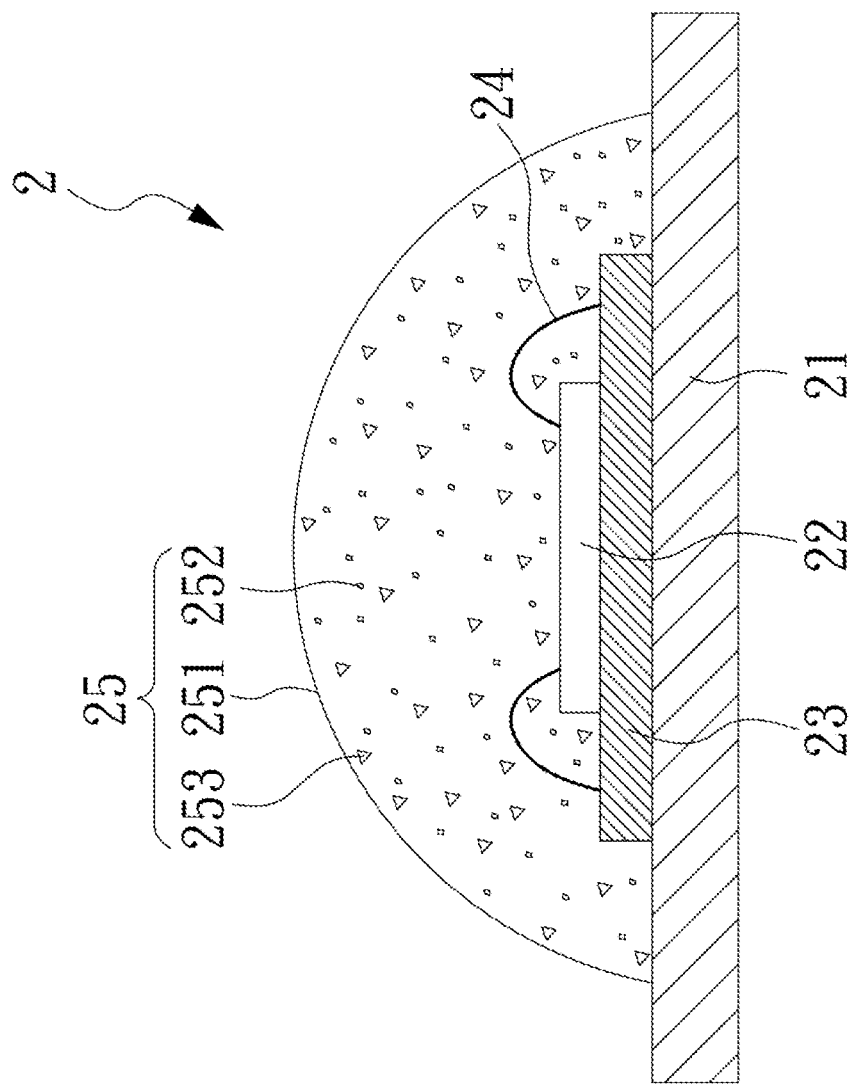
FIG. 3 is a schematic diagram of an LED according to another embodiment of the present invention.

FIG. 3 shows a schematic diagram of an LED according to another embodiment of the present invention. Referring to FIG. 3, an LED 2 includes an insulating substrate 21, a chip 22, a conducting wire frame 23, a conducting wire 24 and a transparent package material 25. The chip 21 is disposed on the insulating substrate 21. The conducting wire frame 23 is clamped between the insulating substrate 21 and the chip 22. The conducting wire 24 has one end connected to the chip, and the other end connected to the conducting wire frame 23. The transparent package material 25 is a heat conducting composite material, and includes epoxy 251, a plurality of graphene sheets 252, and a plurality of grains of fluorescent power 253. Further, the transparent package material 25 is covered on the simulating substrate 21.

In the embodiment, each of the graphene sheets 252 is a transparent graphene sheet having a high degree of graphitization, and is in a multi-layer sheet structure having 50 to 70 layers. A distance (Lc) between the layers of the graphene sheet 252 is in a nanometer scale between 15 nm and 21 nm, and a lateral size of a basal plane of the graphene sheet 252 is between 50 nm and 60 nm. The graphene sheets 252 constitute 10 wt % of the total weight of the transparent package material.

As such, light emitted from the chip 22 may achieve an expected light color by blending the plurality of gains of fluorescent power 253 having different wavelengths. Further, as the graphene sheets 252 of the transparent package material 25 are in transparent structures, a heat dissipation effect is similarly achieved without affecting the light extraction rate of the LED 2.

Apart from the LEDs in the above embodiments, the heat conducting composite material of the present invention may also be implemented to applications of solar microwave water purifiers, thermal garments and infrared paints.

What is claimed is:

1. A heat conducting composite material, comprising:
    a matrix; and
    a plurality of graphene sheets respectively having a two-dimensional planar structure;
    wherein, a basal plane of each of the graphene sheets has a lateral size (La) between 0.1 nm and 100 nm, and comprises a quantum well structure, and
    wherein the graphene sheets, incorporated into the matrix, constitute 0.1 wt % to 15 wt % of a total weight.

2. The heat conducting composite material of claim 1, wherein the graphene sheets are a transparent graphene sheet.

3. The heat conducting composite material of claim 1, wherein the graphene sheets are a single-layer sheet structure or a multi-layer sheet structure.

4. The heat conducting composite material of claim 3, wherein a number of layers of the multi-layer sheet structure is between 2 and 100.

5. The heat conducting composite material of claim 1, wherein the matrix is a group or a combination selected from an organic material, a fiber material, a ceramic material and a metal material.

6. The heat conducting composite material of claim 5, wherein the organic material is one or a combination of phenolic resin, epoxy, polyester resin, polyamide resin, polyimide resin, polycarbonate resin, polystyrene resin, polyethylene terephthalate, glycol, high density polyethylene, polyvinylchloride, low density polyethylene, polypropylene, polystyrene and polyphenylene carbonate.

7. The heat conducting composite material of claim 5, wherein the fiber material is one or a combination of glass fiber, carbon fiber, boron fiber, aramid fiber, silicon carbide fiber and asbestos fiber.

8. The heat conducting composite material of claim 5, wherein the ceramic material is one or a combination of aluminum oxide, silicon carbide and aluminum oxide.

9. The heat conducting composite material of claim 1, further comprising an additive, the additive being a group or a combination selected from fluorescent powder, a carbon nanotube, hexagonal boron oxide, quartz and a similar material.

10. A thermal garment, comprising:
    a heat conducting composite material, the heat conducting composite material comprising:
        a matrix; and
        a plurality of graphene sheets respectively having a two-dimensional planar structure,
    wherein, a basal plane of each of the graphene sheets has a lateral size (La) between 0.1 nm and 100 nm, and comprises a quantum well structure, and
    wherein the graphene sheets, incorporated into the matrix, constitute 0.1 wt % to 15 wt % of a total weight.

11. A solar microwave water purifier, comprising:
    a heat conducting composite material, the heat conducting composite material comprising:
        a matrix; and
        a plurality of graphene sheets respectively having a two-dimensional planar structure,
    wherein, a basal plane of each of the graphene sheets has a lateral size (La) between 0.1 nm and 100 nm, and comprises a quantum well structure, and
    wherein the graphene sheets, incorporated into the matrix, constitute 0.1 wt % to 15 wt % of a total weight.

12. An infrared paint, comprising:
    a heat conducting composite material, the heat conducting composite material comprising:
        a matrix; and
        a plurality of graphene sheets respectively having a two-dimensional planar structure,
    wherein, a basal plane of each of the graphene sheets has a lateral size (La) between 0.1 nm and 100 nm, and comprises a quantum well structure, and
    wherein the graphene sheets, incorporated into the matrix, constitute 0.1 wt % to 15 wt % of a total weight.

13. A light-emitting diode (LED), comprising:
    an insulating substrate;
    a chip, disposed on the insulating substrate;
    a conducting wire frame, clamped between the insulating substrate and the chip;
    a conducting wire, having one end connected to the chip and one other end connected to the wire conducting frame; and
    a transparent package material, covering on the insulating substrate, being a heat conducting composite material, the heat conducting composite material, comprising:
        a matrix; and
        a plurality of graphene sheets respectively having a two-dimensional planar structure,
    wherein, a basal plane of each of the graphene sheets has a lateral size (La) between 0.1 nm and 100 nm, and comprises a quantum well structure, and
    wherein the graphene sheets, incorporated into the matrix, constitute 0.1 wt % to 15 wt % of a total weight.

* * * * *